United States Patent
Kudo et al.

(10) Patent No.: US 11,764,318 B2
(45) Date of Patent: Sep. 19, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shotaro Kudo, Tokyo (JP); Shinichi Watanuki, Tokyo (JP); Takashi Ogura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 406 days.

(21) Appl. No.: 16/950,479

(22) Filed: Nov. 17, 2020

(65) Prior Publication Data
US 2022/0158005 A1 May 19, 2022

(51) Int. Cl.
*H01L 31/0232* (2014.01)
*H01L 31/18* (2006.01)

(52) U.S. Cl.
CPC ........ *H01L 31/02327* (2013.01); *H01L 31/18* (2013.01)

(58) Field of Classification Search
CPC ....... H01L 31/0232–02366; H01L 31/18–208; G02B 6/12004
See application file for complete search history.

(56) References Cited

U.S. PATENT DOCUMENTS

| 2012/0014636 | A1* | 1/2012 | Matsubara | G02B 6/122 385/14 |
|---|---|---|---|---|
| 2016/0282554 | A1* | 9/2016 | Watanuki | H01L 31/18 |
| 2017/0068051 | A1* | 3/2017 | Watanuki | G02B 6/122 |
| 2019/0123233 | A1 | 4/2019 | Usami | |

FOREIGN PATENT DOCUMENTS

JP 2019-075513 A 5/2019

* cited by examiner

*Primary Examiner* — Andres Munoz
(74) *Attorney, Agent, or Firm* — McDermott Will & Emery LLP

(57) ABSTRACT

A Semiconductor device includes an insulating layer, an optical waveguide, a first dummy semiconductor film, a second semiconductor film and a third semiconductor film. The optical waveguide is formed on the insulating layer. The first dummy semiconductor film is formed on the insulating layer and is spaced apart from the optical waveguide. The first dummy semiconductor film is formed on the first semiconductor film. The second semiconductor film is integrally formed with the optical waveguide as a single member on the insulating layer. The third semiconductor film is formed on the second semiconductor film. A material of the first dummy semiconductor film is different from a material of the optical waveguide. In plan view, a distance between the optical waveguide and the first dummy semiconductor film in a first direction perpendicular to an extending direction of the optical waveguide is greater than a thickness of the insulating layer.

14 Claims, 17 Drawing Sheets

SEMICONDUCTOR DEVICE AND METHOD OF MANUFACTURING THE SAME

BACKGROUND

A present disclosure relates to a semiconductor device and a method of manufacturing the semiconductor device, for example, a semiconductor device including an optical waveguide and method of manufacturing the semiconductor device.

There is a disclosed technique listed below.
[Patent Document 1] Japanese Unexamined Patent Application Publication No. 2019-075513

As an optical communication technology, a silicon photonics technology is known (for example, see Patent Document 1). A semiconductor device described in Patent Document 1 includes an optical waveguide and an optical receiver having photoelectric conversion property. A step of forming the optical receiver includes: (a) forming an insulating film on a first semiconductor film, the insulating film having an opening exposing a part of the first semiconductor film; (b) forming a second semiconductor film on the part of the first semiconductor film exposed from the opening by selective epitaxial growth; (c) removing a semiconductor particle formed on the insulating film in the (b); and (d) forming a wiring layer on the insulating film.

SUMMARY

From the viewpoint of increasing optical absorptance of the optical receiver, it is preferable that a growth temperature of the second semiconductor film is high to some extent, for example, 600° or more. However, if the growth temperature is too high, the semiconductor particle is easily formed on the insulating film. As a result, for example, propagating efficiency of a light through the optical waveguide is reduced, a property of the semiconductor device is reduced. For this reason, in Patent Document 1, the semiconductor particle is removed, for example, by dry-etching.

The semiconductor device described in Patent Document 1 requires a step of protecting the optical receiver and a step of removing the semiconductor particle. There is room for improvement from the viewpoint of productivity.

A problem of embodiments is to improve the property and the productivity of the semiconductor device. Other problems and novel features will become apparent from the description of the specification and drawings.

A semiconductor device according to embodiments includes: an insulating layer; an optical waveguide formed on the insulating layer; a first semiconductor film the formed on the insulating layer, the first semiconductor film spaced apart from the optical waveguide; a first dummy semiconductor film formed on the first semiconductor film; a second semiconductor film formed on the insulating layer, the second semiconductor film integrally formed with the optical waveguide as a single member; and a third semiconductor film formed on the second semiconductor film. A material of the first dummy semiconductor film is different from a material of the optical waveguide. In plan view, a distance between the optical waveguide and the first dummy semiconductor film in a first direction perpendicular to an extending direction of the optical waveguide is greater than a thickness of the insulating layer.

A method of manufacturing a semiconductor device according to embodiments includes: (a) providing a semiconductor wafer including an insulating layer and a semiconductor layer formed on the insulating layer; (b) patterning the semiconductor layer to form an optical waveguide, a first semiconductor film spaced apart from the optical waveguide, a second semiconductor film formed integrally with the optical waveguide as a single member; and (c) forming a first dummy semiconductor film on the first semiconductor film by an epitaxial growth method, and forming a third semiconductor film on the second semiconductor film. A material of the first dummy semiconductor film is different from a material of the optical waveguide. In plan view, in a first direction perpendicular to an extending direction of the optical waveguide, a distance between the optical waveguide and the first dummy semiconductor film is greater than a thickness of the insulating layer.

A semiconductor device according to embodiments can improve the property and productivity of the semiconductor device.

DETAILED DESCRIPTION

Figure 1:
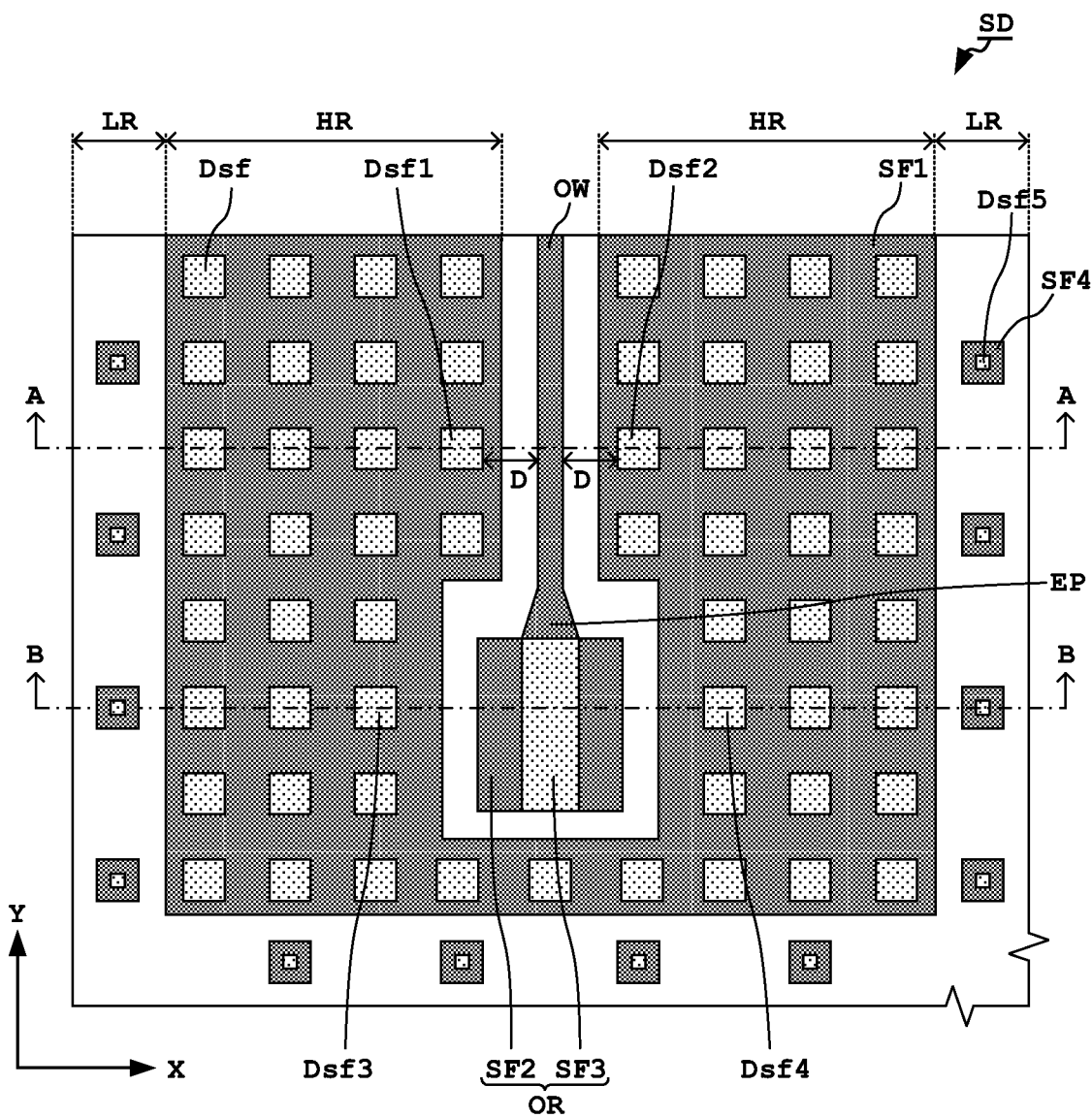
FIG. 1 is a plan view illustrating an exemplary configuration of a main portion of a semiconductor device according to an embodiment.

Hereinafter, a semiconductor device according to an embodiment will be described in detail by referring to the drawings. In the specification and drawings, the same or corresponding constituent elements are denoted by the same reference numerals or hatching, and overlapping descriptions are omitted. In the drawings, for convenience of description, the configuration may be omitted or simplified. In addition, a cross-sectional view may be shown as an end view from the viewpoint of visibility.

[Configuration of Semiconductor Device]

Figure 2A:
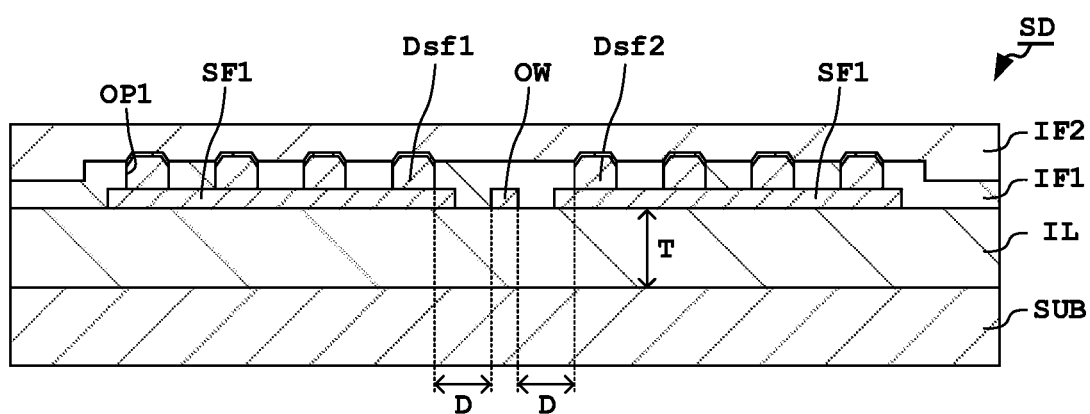
FIG. 2A and FIG. 2B are cross-sectional views illustrating an exemplary configuration of the main portion of the semiconductor device according to the embodiment.
Figure 2B:
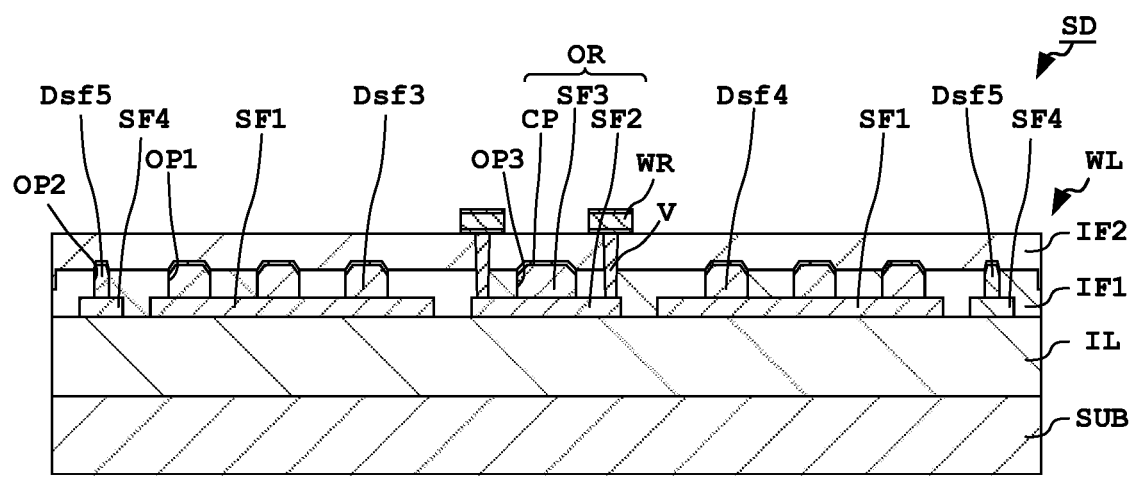

FIG. 1 is a plan view illustrating an exemplary configuration of a main portion of a semiconductor device SD according to present embodiment. FIG. 2A and FIG. 2B are cross-sectional views illustrating the exemplary configuration of the main portion of the semiconductor device SD.

FIG. 2A is the cross-sectional view taken along line A-A of FIG. 1. FIG. 2B is the cross-sectional view along line B-B of FIG. 1.

The semiconductor device SD includes a semiconductor substrate SUB, an insulating layer IL, an optical waveguide OW, a first semiconductor film SF1, a fourth semiconductor film SF4, a second semiconductor film SF2, a first insulating film IF1, a plurality of dummy semiconductor films Dsf, a third semiconductor film SF3, a cap film CP and a wiring layer WL. The third semiconductor film SF3, the fourth semiconductor film SF4, and the cap film CP constitutes an optical receiver OR having a photoelectric conversion property. The wiring layer WL includes a second insulating film IF2, a via V and a wiring WR.

A configuration of each of the plurality of dummy semiconductor films Dsf is the same except for location and size. Therefore, only a first dummy semiconductor film Dsf1, a second dummy semiconductor film Dsf2, a third dummy semiconductor film Dsf3, a fourth dummy semiconductor film Dsf4 and a fifth dummy semiconductor film Dsf5 are mainly described. Incidentally, from the viewpoint of visibility, in FIG. 1, the insulating film IF, the cap film CP and wiring layer WL are omitted.

The semiconductor substrate SUB supports optical elements such as the optical waveguide OW and the optical receiver OR through the insulating layer IL. An example of type of the semiconductor substrate SUB includes a silicon substrate. The silicon substrate is, for example, a silicon single-crystal substrate including a p-type impurity such as boron (B) and phosphorus (P). For example, a plane orientation of a main surface of the silicon substrate is (100), and the resistivity of the silicon substrate is 5 Ω·cm or more and 50 Ω·cm or less. A thickness of the semiconductor substrate SUB is, for example, 100 μm or more and 900 μm or less.

The insulating layer IL is formed on the semiconductor substrate SUB. The insulating layer IL is a cladding layer for substantially confining a light propagating inside the optical waveguide OW into the optical waveguide OW. The insulating layer IL is formed of a material having a refractive index smaller than a refractive index of a material of the optical waveguide OW. An example of the material for the insulating layer IL includes silicon oxide ($SiO_2$). The refractive index of the material of the insulating layer IL is, for example, 1.46. In present specification, the refractive index is a numerical value for light having a wavelength of 1.5 μm.

It is preferable that a thickness T of the insulating layer IL is greater than an exuding distance of the light exuding from the optical waveguide OW. From the viewpoint of reducing stress applied to the semiconductor device SD and from the viewpoint of suppressing sticking of the semiconductor wafer by an electrostatic chuck in manufacturing the semiconductor device SD, it is preferable that the thickness of the insulating layer IL is small. For example, the thickness T of the insulating layer ILs is 2 μm or more and 3 μm or less. Here, the thickness T of the insulating layer IL is a distance between an upper surface of the insulating layer IL and a lower surface of the insulating layer IL in an opposing direction of the upper surface and the lower surface of the insulating layer IL.

Incidentally, when the insulating layer IL functions as a support, the semiconductor device SD may not include the semiconductor substrate SUB. The insulating layer IL is, for example, sapphire substrate.

The optical waveguide OW is a path within which light can propagate. The optical waveguide OW is formed on the insulating layer IL. The optical waveguide OW, in plan view, is formed between a part of the plurality of dummy semiconductor films Dsf and another part of the plurality of dummy semiconductor films Dsf. The optical waveguide OW, when viewed in plan, in a direction perpendicular to the extending direction of the optical waveguide OW, is formed between the first dummy semiconductor film Dsf1 and the second dummy semiconductor film Dsf2. An end part EP of the optical waveguide OW is optically connected with the optical receiver OR. In present embodiment, the end part EP of the optical waveguide OW is integrally formed with the second semiconductor film SF2 of the optical receiver OR as a single member.

It is preferable that a width of the end part EP of the optical waveguide OW is increased as approaching the optical receiver OR. In other words, it is preferable that the end part EP of the optical waveguide OW has a substantially triangular shape in plan view. If the width of the end part EP of the optical waveguide OW is increased as approaching the optical receiver OR, an area of the optical waveguide OW in a plan view is increased. Therefore, in a plan view, the end part EP of the optical waveguide OW is likely to overlap with a semiconductor particle (described later). As a result, in the end part EP of the optical waveguide OW, there is a tendency that a propagation loss due to light scattering increases. In present embodiment, since it is possible to suppress the formation of the semiconductor particle, it is possible to effectively suppress the light scattering at the end part EP of the optical waveguide OW.

A thickness of the optical waveguide OW is not particularly limited as long as the optical waveguide OW can propagate light. The thickness of the optical waveguide OW is, for example, 200 nm or more and 400 nm or less. Here, the thickness of the optical waveguide OW, in an opposing direction of an upper surface and a lower surface of the optical waveguide OW, a distance between the upper surface and the lower surface of the optical waveguide OW.

A width of the optical waveguide OW is 300 nm or more and 500 nm or less. Here, the width of the optical waveguide OW, in the opposing direction of a first side surface and a second side surface of the optical waveguide OW, a distance between the first side surface and the second side surface of the optical waveguide OW.

In a cross section perpendicular to the extending direction of the optical waveguide OW, the cross-sectional shape of the optical waveguide OW is rectangular or trapezoidal. An example of a material of the optical waveguide OW includes silicon (Si) and germanium (Ge). An example of a crystal structure of the material of the optical waveguide OW includes single crystal and polycrystal. From the viewpoint of reducing the propagation loss of light in the optical element, it is preferable that the crystal structure of the material of the optical waveguide OW is single crystal.

The first semiconductor film SF1 is formed on the insulating layer IL. The first semiconductor film SF1 is spaced apart from the optical waveguide OW. It is preferable that a distance between the first semiconductor film SF1 and the optical waveguide OW, in a direction along a surface of the insulating layer IL, is greater than the thickness T of the insulating layer IL. Thus, it is possible to suppress the light exuded from the optical waveguide OW is scattered by the first semiconductor film SF1, as a result, it is possible to reduce the propagation loss of light.

The first semiconductor film SF1 faces the first side surface of the optical waveguide OW, and the second side surface of the optical waveguide OW in plan view. The first semiconductor film SF1 is formed between the optical waveguide OW and the fourth semiconductor film SF4 in plan view. The first semiconductor film SF1 is formed such that the first semiconductor film SF1 partially surrounds the optical receiver OR in plan view. The optical receiver OR is formed between a part of the plurality of dummy semiconductor films Dsf and another part of the plurality of dummy semiconductor films Dsf in plan view. The optical receiver OR, when viewed in plan, in the direction perpendicular to the extending direction of the optical waveguide OW, is formed between the third dummy semiconductor film Dsf3 and the fourth dummy semiconductor film Dsf4.

A material of the first semiconductor film SF1 includes, for example, silicon. Size and shape of the first semiconductor film SF1 is appropriately adjusted in accordance with the number and size of the plurality of dummy semiconductor films Dsf. A thickness of the first semiconductor film SF1 is not particularly limited. The thickness of the first semiconductor film SF1, for example, is the same as the thickness of the optical waveguide OW.

The fourth semiconductor film SF4 is formed on the insulating layer IL. The fourth semiconductor film SF4 is spaced apart from the optical waveguide OW. In the direction along the surface of insulating layer IL, the fourth semiconductor film SF4 is located farther from the optical waveguide OW than the first semiconductor film SF1. The fourth semiconductor film SF4 may be formed integrally with the first semiconductor film SF1 as a single member or may be formed separately. In present embodiment, the fourth semiconductor film SF4 is formed separately from the first semiconductor film SF1.

A material of the fourth semiconductor film SF4 includes, for example, silicon. The size and shape of the fourth semiconductor film SF4 is appropriately adjusted in accordance with the number and size of the plurality of dummy semiconductor films Dsf. A thickness of second semiconductor film SF2 is not particularly limited. The thickness of the fourth semiconductor film SF4, for example, is the same as the thickness of the optical waveguide OW.

The second semiconductor film SF2 is part of the optical receiver OR. The second semiconductor film SF2 is formed on the insulating layer IL. The second semiconductor film SF2 is integrally formed with the end part EP of the optical waveguide OW as a single member. The second semiconductor film SF2 includes a semiconductor region of a first conductivity type. The semiconductor region may be formed in a part of the second semiconductor film SF2, or may be formed in an entirety of the second semiconductor film SF2. The first conductivity type is p-type or n-type. When the first conductivity type is p-type, the second semiconductor film SF2 includes a p-type impurity such as boron (B) and boron difluoride ($BF_2$). When the first conductivity type is n-type, the second semiconductor film SF2 includes an n-type impurity such as arsenic (As) and phosphorus (P). An impurity concentration of the semiconductor region is, for example, $1 \times 10^{19}$ $cm^{-3}$ or more and $1 \times 10^{20}$ $cm^{-3}$ or less.

A material of the second semiconductor film SF2 includes, for example, silicon. A thickness of the second semiconductor film SF2 is not particularly limited. The thickness of second semiconductor film SF2, for example, is the same as the thickness of the optical waveguide OW.

The first insulating film IF1 is formed on the insulating layer IL such that the first insulating film IF1 covers the optical waveguide. The first insulating film IF1 defines a region in which an epitaxial growth layer is to be formed and a region in which the epitaxial growth layer is not to be formed in a selective epitaxial growth method. A thickness of the first insulating film IF1 is not particularly limited as long as the above-mentioned function can be obtained. The thickness of the first insulating film IF1 is, for example, 0.1 or more and 0.2 μm or less.

The first insulating film IF1 has a plurality of first openings OP1, a plurality of second openings OP2, and a third opening OP3. The plurality of first openings OP1, the plurality of second openings OP2, and the third opening OP3 are spaced apart from each other. The plurality of dummy semiconductor films Dsf is respectively formed in each of the plurality of first openings OP1 and each of the plurality of second openings OP2. Size, location and shape of the first opening OP1 and the second opening OP2 are appropriately adjusted in accordance with size, location and shape of the dummy semiconductor film Dsf. The second semiconductor film SF2 is formed in the third opening OP3. The size, location and shape of the third opening OP3 are appropriately adjusted in accordance with size, location and shape of the second semiconductor film SF2. An example of a material of the first insulating film IF1 includes silicon oxide ($SiO_2$) and silicon nitride (SiN).

As shown in FIG. 2A and FIG. 2B, a part of the first insulating film IF1 is formed such that a part of the first insulating film IF1 is located between the first semiconductor film SF1 and the second semiconductor film SF2. In other words, the first insulating film IF1 is formed such that the part of the first insulating film IF1 is sandwiched by the first semiconductor film SF1 and the second semiconductor film SF2. The first insulating film IF1 is formed such that the part of the first insulating film IF1 is located between the first dummy semiconductor film Dsf1 and the third semiconductor film SF3. That is, the other dummy semiconductor film Dsf is not formed between the first dummy semiconductor film Dsf1 and the third semiconductor film SF3.

The location of each of the plurality of dummy semiconductor films Dsf is not particularly limited. It is preferable that the plurality of dummy semiconductor films Dsf are formed by equal intervals from each other. Designing is easier and productivity of the semiconductor device SD is improved. It is preferable that the plurality of dummy semiconductor film Dsf is arranged in a lattice shape. For example, the plurality of dummy semiconductor film Dsf may be arranged in a square lattice shape, or may be arranged in an orthorhombic lattice shape. Further, the plurality of dummy semiconductor film Dsf, in plan view, may be arranged along a direction different from the extending direction (Y direction) of the optical waveguide OW, and the direction (X direction) perpendicular to the extending direction of the optical waveguide OW.

The plurality of dummy semiconductor film Dsf, as described above, includes the first dummy semiconductor film Dsf1, the second dummy semiconductor film Dsf2, the third dummy semiconductor film Dsf3, the fourth dummy semiconductor film Dsf4 and the fifth dummy semiconductor film Dsf5. The first dummy semiconductor film Dsf1, the second dummy semiconductor film Dsf2, the third dummy semiconductor film Dsf3, and the fourth dummy semiconductor film Dsf4 are formed on the insulating layer IL through the first semiconductor film SF1. The fifth dummy semiconductor film Dsf5 is formed on the insulating layer IL through the fourth semiconductor film SF4.

Here, "dummy semiconductor film" means a semiconductor film that does not contribute to a transmission of an optical signal and an electrical signal. Therefore, the dummy semiconductor film Dsf is not optically connected with the optical waveguide OW, and is not electrically connected with wiring WR.

Each configuration of the first dummy semiconductor film Dsf1, the second dummy semiconductor film Dsf2, the third dummy semiconductor film Dsf3, the fourth dummy semiconductor film Dsf4 and the fifth dummy semiconductor film Dsf5 is the same to each other except for the position and size. Therefore, only the first dummy semiconductor film Dsf1 will be described as a respective example except for the position.

The thickness of the first dummy semiconductor film Dsf1 is not particularly limited. The thickness of the first dummy semiconductor film Dsf1 may be the same as or different from the thickness of the third semiconductor film SF3. From the viewpoint of increasing flatness of the second insulating film IF2, it is preferable that the thickness of the first dummy semiconductor film Dsf1, for example, is the same as the thickness of the third semiconductor film SF3.

A shape of the first dummy semiconductor film Dsf1 is not particularly limited. The shape of the first dummy semiconductor film Dsf1 in plan view may be a substantially polygonal shape including a substantially rectangular shape, or may be a substantially circular shape. In present embodiment, in plan view, the shape of the first dummy semiconductor film Dsf1 is substantially rectangular.

A size of the first dummy semiconductor film Dsf1 is not particularly limited. Although described later in detail, from the viewpoint of the thickness of the second semiconductor film SF2 to be substantially the same as the thickness of the first dummy semiconductor film Dsf1, it is preferable that the size of the first dummy semiconductor film Dsf1 is large. Thus, it is possible to increase the flatness of the second insulating film IF2.

In plan view, in a direction (X direction) perpendicular to the extending direction of the optical waveguide OW, a distance D between the optical waveguide OW and the first dummy semiconductor film Dsf1 is greater than a thickness T of the insulating layer IL. Thus, it is possible to suppress light exuded from the optical waveguide OW is scattered by the first dummy semiconductor film Dsf1, as a result, it is possible to reduce the propagation loss of light. In addition, from the viewpoint of sufficiently enhancing the interaction of the first dummy semiconductor film Dsf1, which will be described later, it is preferable that the distance D is small to some extent. Although described later in detail, from the viewpoint of increasing the effect (a first effect described later) of suppressing formation of the semiconductor particle which should not be formed in the vicinity of the optical waveguide OW, it is preferable that the distance D is twice the thickness T of insulating layer IL or less. From the viewpoint of achieving both a reduction in propagation loss of light and planarization of the first semiconductor film SF1, it is preferable that the distance D is substantially the same as the thickness T.

Incidentally, for the third dummy semiconductor film Dsf3 and the fourth dummy semiconductor film Dsf4, the distance between the third semiconductor film SF3 and the third dummy semiconductor film Dsf3 (the fourth dummy semiconductor film Dsf4) corresponds to the distance D.

A material of the first dummy semiconductor film Dsf1 differs from a material of the optical waveguide OW. The material of the first dummy semiconductor film Dsf1 is the same as the material of the third semiconductor film SF3. the material of the first dummy semiconductor film Dsf1 includes, for example, germanium.

The size, shape, and material of each of the plurality of dummy semiconductor films Dsf may be the same or different from each other. From the viewpoint of increasing the flatness of the second insulating film IF2, it is preferable that the size of each of the plurality of dummy semiconductor film Dsf is the same. In present embodiment, the size, shape, and material of the first dummy semiconductor film Dsf1, the second dummy semiconductor film Dsf2, the third dummy semiconductor film Dsf3, and the fourth dummy semiconductor film Dsf4 are the same.

The size and shape of each of the first dummy semiconductor film Dsf1 and the fifth dummy semiconductor film Dsf5 differ from each other. The size of the fifth dummy semiconductor film Dsf5, in plan view, is smaller than the size of the first dummy semiconductor film Dsf1. Thus, in the semiconductor device SD, it is possible to reduce the parasitic capacitance formed between the fifth dummy semiconductor film Dsf5 and the wiring WR.

In present embodiment, the semiconductor device SD includes a high-density region HR of the plurality of dummy semiconductor films Dsf, and a low-density region LR of the plurality of dummy semiconductor films Dsf. The low-density region LR is located farther from the optical waveguide OW than the high-density region HR. The high-density region HR is formed between the optical waveguide OW and the low-density region LR. Although described later in detail, by the high-density region HR is formed in the vicinity of the optical waveguide OW, the semiconductor particle causing light propagation loss can be more effectively suppressed that is formed in the vicinity of the optical waveguide OW.

The third semiconductor film SF3 is formed on the second semiconductor film SF2. The third semiconductor film SF3 includes a semiconductor region having a second conductivity type opposite the first conductivity type. The semiconductor region may be formed in a part of the third semiconductor film SF3, or may be formed in an entirety of the third semiconductor film SF3. The semiconductor region is formed in an upper part of the third semiconductor film SF3, for example. An impurity concentration of the semiconductor region is, for example, $1 \times 10^{19}$ cm$^{-3}$ or more and $1 \times 10^{20}$ cm$^{-3}$ or less.

A material of third semiconductor film SF3 includes, for example, germanium. From the viewpoint of increasing the absorption of light, it is preferable that the thickness of the third semiconductor film SF3 is large. The thickness of the third semiconductor film SF3 is, for example, 0.5 μm or more.

The cap film CP is a protective film for protecting the third semiconductor film SF3. The cap film CP covers the third semiconductor film SF3. The material and the thickness of the cap film CP are not particularly limited as long as the above function can be exhibited. The example of the material of the cap film CP includes silicon (Si) and silicon germanium (SiGe). The cap film CP includes an impurity of the second conductivity type. It is preferable that the thickness of the cap film CP is small from the viewpoint of reducing the resistance of the cap film CP. The thickness of the cap film CP is, for example, 20 nm or more and 50 nm or less.

The wiring layer WL is formed on the first insulating film IF1. The wiring layer WL includes a second insulating film IF2, a via V and the wiring WR.

The second insulating film IF2 is formed on the first insulating film IF1. A material of the second insulating film IF2 includes, for example, silicon oxide. From the viewpoint of suppressing light exuded from the optical waveguide is scattered by the wiring WR formed on the second insulating film IF2, it is preferable that the thickness of the second insulating film IF2 is 1.5 μm or more. The thickness of the second insulating film IF2 is appropriately adjusted in accordance with the thickness of the first insulating film IF1. The thickness of the second insulating film IF2 is adjusted so that a sum of the thickness of the first insulating film IF1 and the thickness of the second insulating film IF2 is 1.5 μm or more and 2.0 μm or less.

The via V is formed in the first insulating film IF1 and the second insulating film IF2 such that the via V reaches the second semiconductor film SF2. The via V is electrically connected with the second semiconductor film SF2 of the optical receiver OR. More specifically, the via V is electrically connected with the second semiconductor film SF2 and the wiring WR with each other.

The wiring WR is formed on the second insulating film IF2. The wiring WR is electrically connected with the second semiconductor film SF2 of the optical receiver OR through the via V. The wiring WR is, for example, barrier metal, a stacked film in which a barrier metal, a conductive film and a barrier metal are stacked in this order. An example of a material constituting the barrier metal includes titanium (Ti), tantalum (Ta), titanium nitride (TiN) and tantalum nitride (TaN). An example of a material of the conductive film includes aluminum, copper and tungsten.

[Method of Manufacturing Semiconductor Device]

Next, an exemplary method of manufacturing the semiconductor device SD according to present embodiment will be described. FIGS. 3A, 3B through 7A, 7B are cross-sectional views illustrating exemplary steps included in the method of manufacturing the semiconductor device SD.

The method of manufacturing the semiconductor device SD according to the embodiment, (1) providing a semiconductor wafer SW, (2) forming the optical waveguide OW, the first semiconductor film SF1, the second semiconductor film SF2 and the fourth semiconductor film SF4, (3) forming the first insulating film IF1, (4) forming the optical receiver OR and the plurality of dummy semiconductor film Dsf and (5) forming the wiring layer WL.

(1) Providing a Semiconductor Wafer SW

Figure 3A:
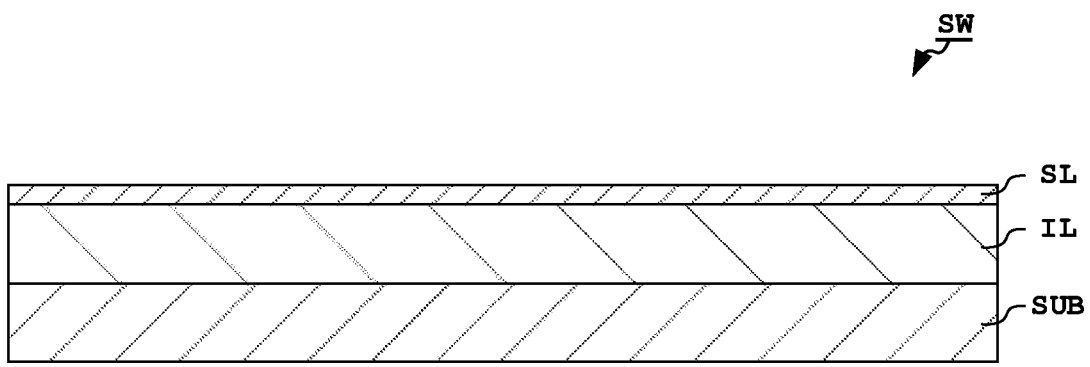
FIG. 3A and FIG. 3B are cross-sectional views illustrating an exemplary step included in a method of manufacturing the semiconductor device according to the embodiment.
Figure 3B:
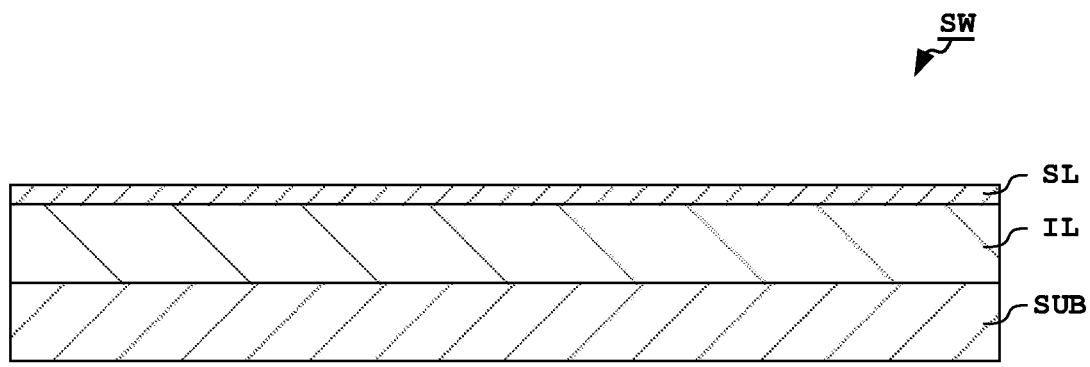

First, as shown in FIG. 3A and FIG. 3B, a semiconductor wafer SW including the semiconductor substrate SUB, the insulating layer IL formed on the semiconductor substrate SUB, and a semiconductor layer SL formed on the insulating layer IL is provided. The semiconductor wafer SW may be manufactured or purchased as a commercial product.

The semiconductor wafer SW is, for example, an SOI (Silicon On Insulator) substrate. The method of manufacturing the SOI substrate can be appropriately selected from a known manufacturing method. An example of manufacturing the SOI substrate includes SIMOX (Separation by Implantation of Oxygen) method and smart-cut method. An example of a material of the semiconductor substrate SUB is described above. An example of a material of the semiconductor layer SL include silicon and germanium. The crystal structure of the material of the semiconductor layer SL may be single crystal or polycrystalline.

(2) Forming the optical waveguide OW, the first semiconductor film SF1, the second semiconductor film SF2 and the fourth semiconductor film SF4

Figure 4A:
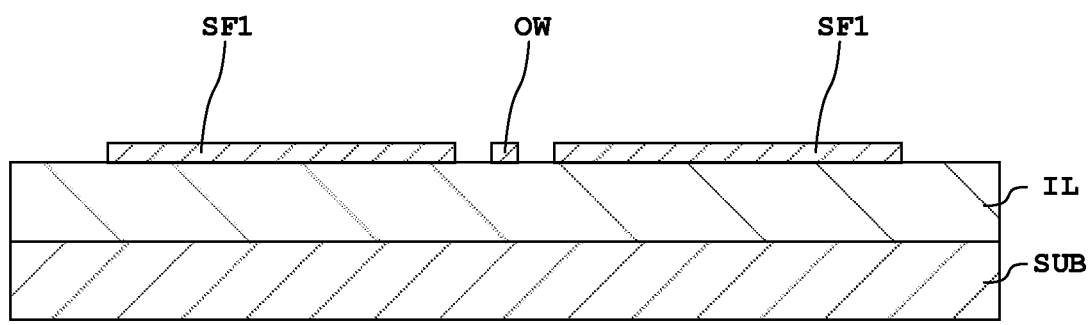
FIG. 4A and FIG. 4B are cross-sectional views illustrating an exemplary step included in a method of manufacturing the semiconductor device according to the embodiment.
Figure 4B:
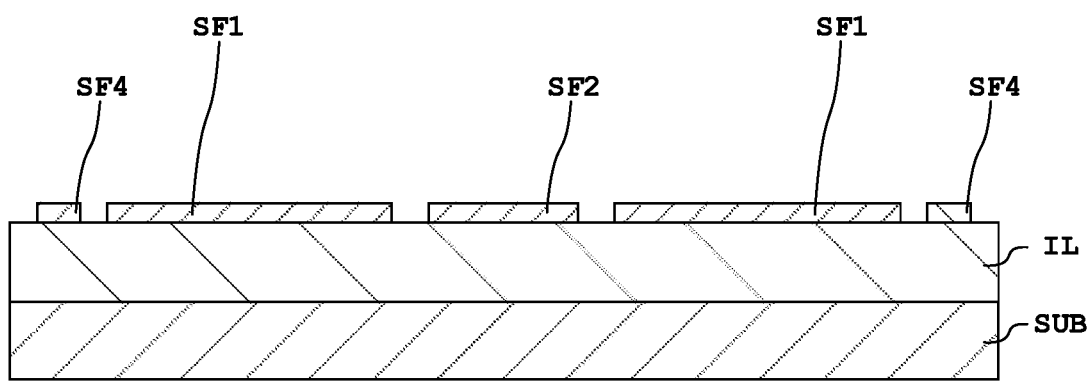

Subsequently, the semiconductor layer SL of the semiconductor wafer SW provided is patterned, as shown in FIGS. 4A and 4B. Thus, the first semiconductor film SF1 and the fourth semiconductor film SF4 which are spaced apart from the optical waveguide OW, and the optical waveguide OW and the second semiconductor film SF2 which are formed integrally with each other is formed as a single member. For example, patterning is performed by photolithography method and etching method.

An impurity of a desired impurity concentration is implanted into the second semiconductor film SF2 by photolithography method and ion implantation method. Subsequently, an annealing treatment is performed to activate the impurity implanted. The ion implantation may be performed before the patterning of the semiconductor layer SL or may be performed after the patterning of the semiconductor layer SL.

Figure 5A:
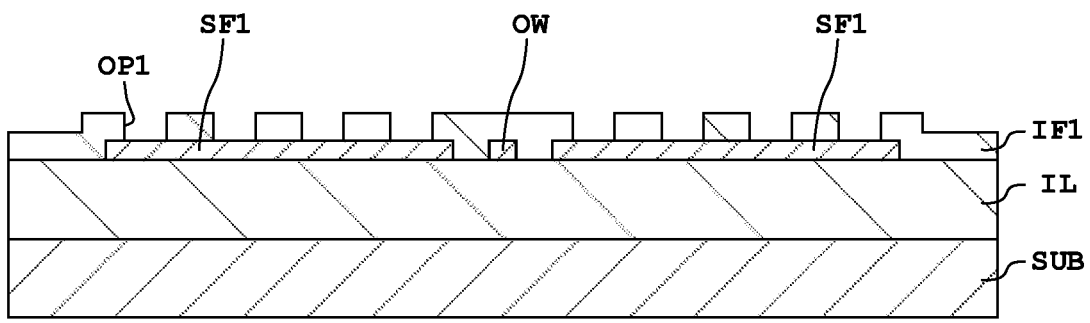
FIG. 5A and FIG. 5B are cross-sectional views illustrating an exemplary step included in a method of manufacturing the semiconductor device according to the embodiment.
Figure 5B:
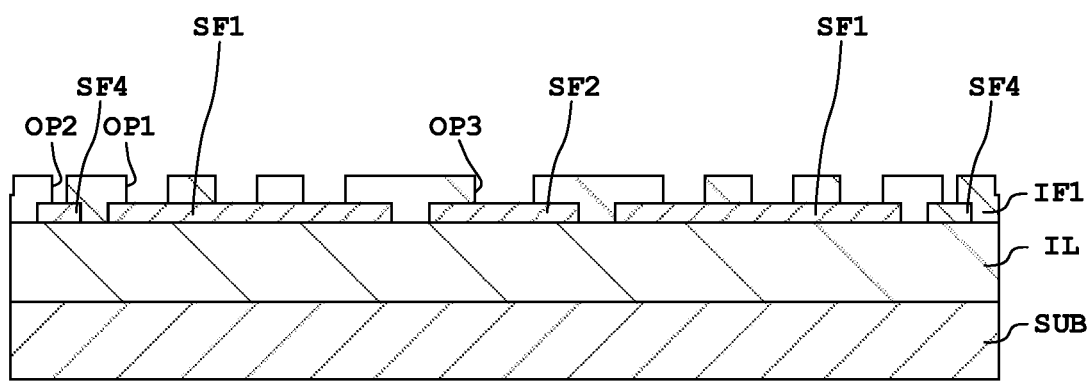

(3) Forming the First Insulating Film IF1 Subsequently, as shown in FIG. 5A and FIG. 5B, the first insulating film IF1 is formed on the insulating layer IL so as to cover the optical waveguide OW. A method of forming the first insulating film IF1 is, for example, a CVD method. The first insulating film IF1 has the plurality of first openings OP1, the plurality of second openings OP2, and the third opening OP3. The plurality of first openings OP1, the plurality of second openings OP2, and the third opening OP3 are formed, for example, by photolithography method and etching method.

Figure 6A:
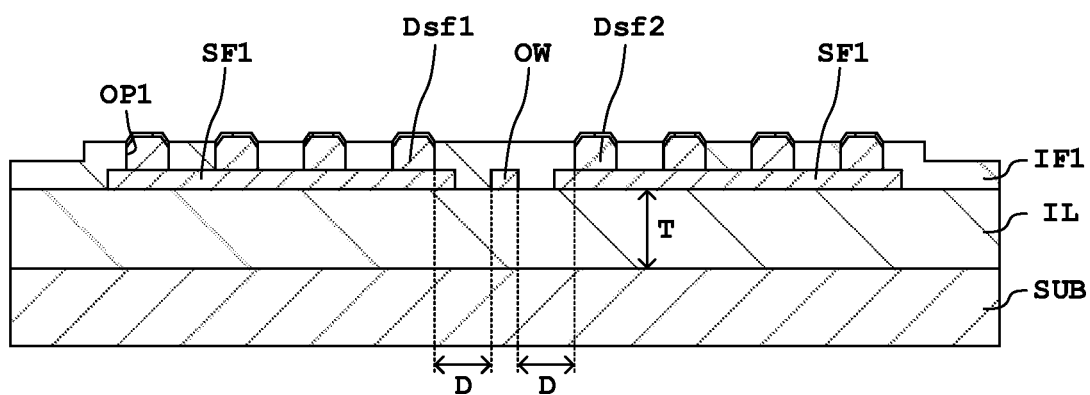
FIG. 6A and FIG. 6B are cross-sectional views illustrating an exemplary step included in a method of manufacturing the semiconductor device according to the embodiment.
Figure 6B:
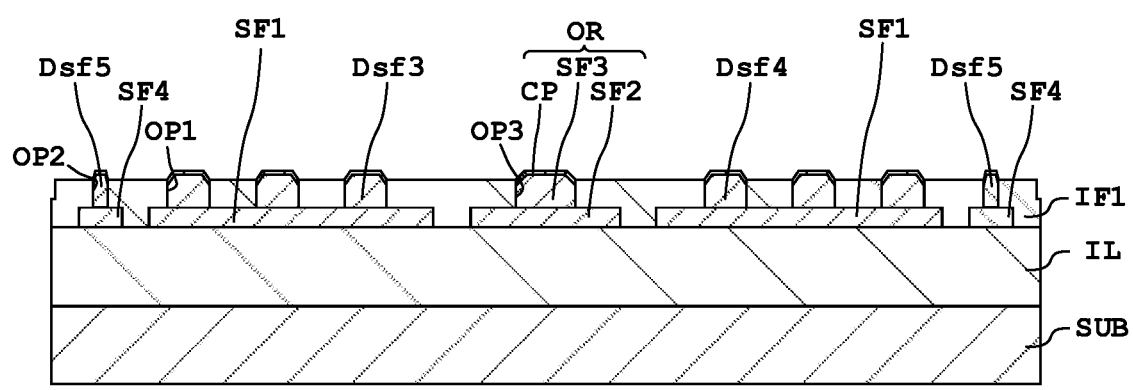

(4) Forming the Optical Receiver OR and the Plurality of Dummy Semiconductor Films Dsf Subsequently, as shown in FIG. 6A and FIG. 6B, the optical receiver OR and the plurality of dummy semiconductor films Dsf are formed. First, a first epitaxial growth film is formed in the plurality of first openings OP1, the plurality of second openings OP2, and the third opening OP3 by an epitaxial growth method. Thus, a plurality of dummy semiconductor film Dsf are respectively formed in the plurality of first opening OP1 and the plurality of second openings OP2.

Here, from the viewpoint of increasing the productivity of the semiconductor device SD, a film forming temperature is preferably 450° C. or more, more preferably 500° C. or more, and further preferably 550° C. or more. Further, it is preferable that the film forming temperature is 700° C. or less. A pressure during growth is preferably 10 Torr or more and 50 Torr or less. The film forming temperature is a set temperature when forming the first epitaxial growth film by an epitaxial growth method. The pressure during growth is a set pressure when forming the first epitaxial growth film by an epitaxial growth method. Although described later in more detail, in present embodiment, by the dummy semiconductor film Dsf, it is possible to increase the productivity without reducing the characteristics of semiconductor device SD.

Subsequently, a second epitaxial growth film is formed by an epitaxial growth method so as to cover the first epitaxial growth film. Subsequently, by an ion-implantation method, an impurity of a desired impurity concentration is introduced into the first epitaxial growth film located in the third opening OP3 and the second epitaxial growth film. As a result, the third semiconductor film SF3 and the cap film CP are formed. Consequently, the second semiconductor film SF2, the optical receiver OR including the third semiconductor film SF3 and the cap film CP is formed.

The second epitaxial growth film may or may not be formed on the first epitaxial growth film constituting the dummy semiconductor film Dsf. In present embodiment, the second epitaxial growth film (the cap film) is also formed on the first epitaxial growth film constituting the dummy semiconductor film (Dsf). From the viewpoint of increasing flatness of the second insulating film IF2, it is preferable that second epitaxially grown film (the cap film) is formed on the first epitaxially grown film constituting the dummy semiconductor film Dsf. An impurity may or may not be introduced into the dummy semiconductor film Dsf.

(5) Forming the Wiring Layer

Figure 7A:
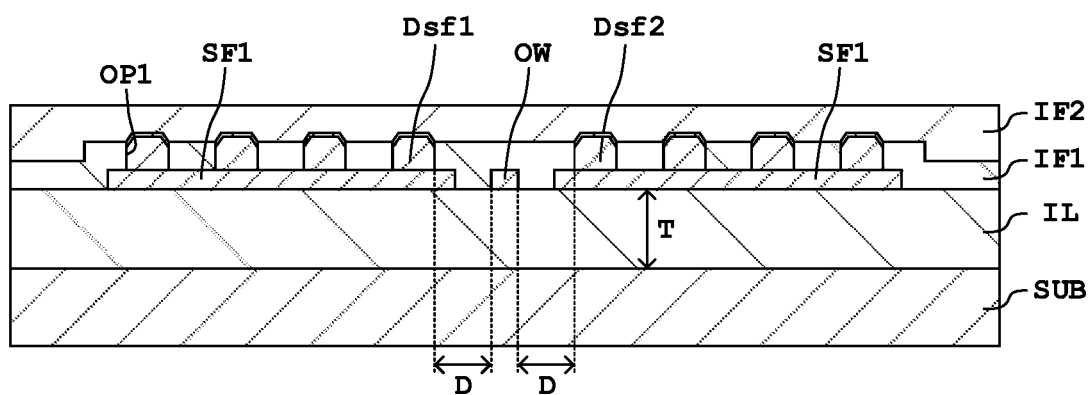
FIG. 7A and FIG. 7B are cross-sectional views illustrating an exemplary step included in a method of manufacturing the semiconductor device according to the embodiment.
Figure 7B:
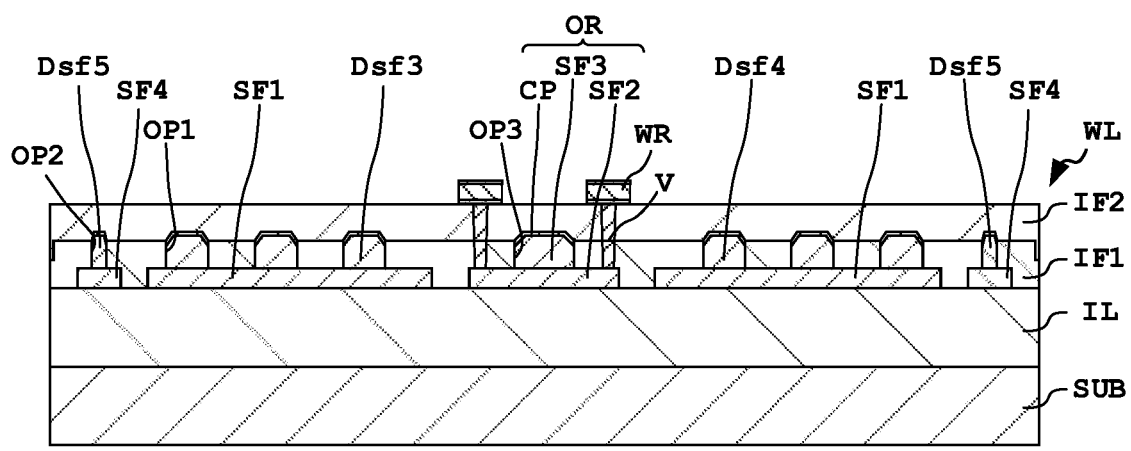

Subsequently, as shown in FIG. 7A and FIG. 7B, the wiring layer WL is formed on the first insulating film IF1. As a method of forming the wiring layer WL, a method known as a method of forming multilayer wiring layer in the semiconductor technology can be employed. First, for example, the second insulating film IF2 is formed on the first insulating film IF1 by CVD-method. Then, after forming a through hole in the second insulating film IF2, the via V is formed by burying a conductive material in the through hole. A method of burying the conductive material in the through hole, for example, a CVD method or a sputtering method. For example, after forming a conductive film on the second insulating film IF2 by a sputtering method, the wiring WR is formed by patterning the conductive film to a desired shape.

In present embodiment, since the plurality of dummy semiconductor film Dsf is formed, it is possible to increase flatness of the second insulating film IF2. Therefore, for example, a planarization treatment of the second insulating film IF2 by the CMP method may or may not be performed.

Finally, by dicing the structures obtained by the above steps, a plurality of singulated semiconductor devices SD are obtained.

The method of manufacturing the semiconductor device SD according to the present embodiment may further include other steps as required. For example, an example of another step include a step of arranging a laser diode as a light source, a step of forming a grating coupler, a step of forming a spot size converter, and a step of forming an optical receiver. The other steps may be suitably adopted from the formation methods known in the silicon photonics art.

The semiconductor device SD according to present embodiment is manufactured by the manufacturing method.

(Effect of the Dummy Semiconductor Film Dsf)

Figure 8A:
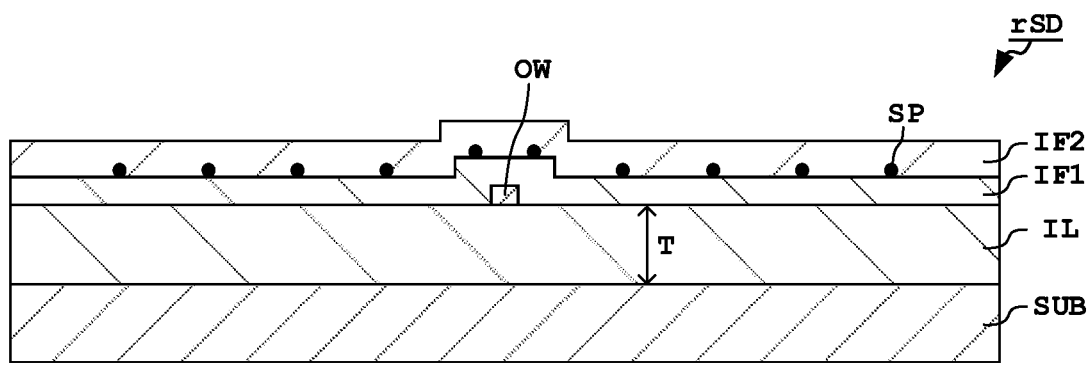
FIG. 8A and FIG. 8B are cross-sectional views illustrating an exemplary configuration of a comparative semiconductor device.
Figure 8B:
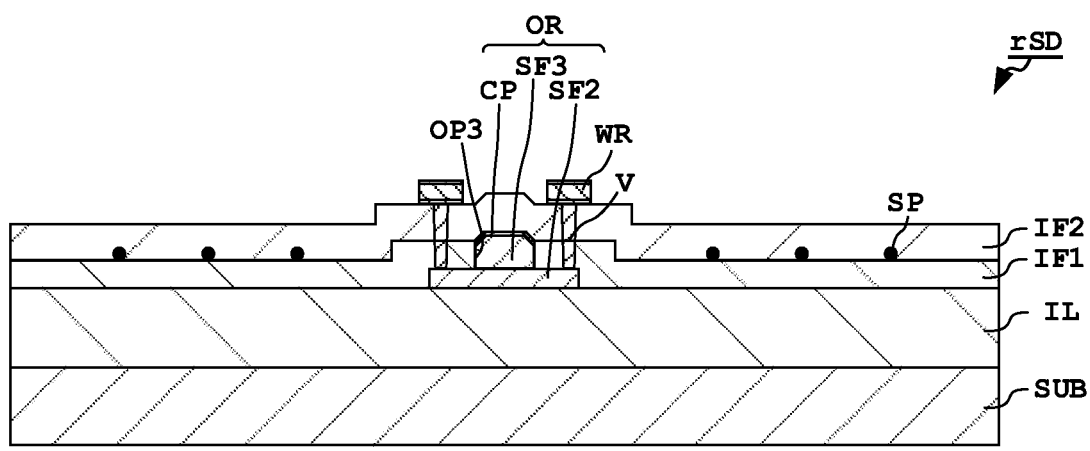

Next, the effect of the dummy semiconductor film Dsf will be described. For comparison, method of manufacturing a comparative semiconductor device without the dummy semiconductor film Dsf will be described. FIG. 8A and FIG. 8B are cross-sectional views illustrating an exemplary configuration of the comparative semiconductor device rSD.

(First Effect)

As shown in FIG. 8A and FIG. 8B, when the third semiconductor film SF3 is formed by an epitaxial growth method, an upper surface of the first insulating film IF1 is also exposed to material gas supplied. Therefore, the semiconductor particle SP formed of the material gas is sometimes formed on the first insulating film IF1. In particular, when a growth rate of the first epitaxial growth film EF1 is increased, the semiconductor particle SP is easily formed. When the semiconductor particle SP is formed in the vicinity of the optical waveguide OW, light exuded from the optical waveguide OW is scattered by the semiconductor particle SP. As a result, the propagation loss of light increases. Therefore, the method of manufacturing the comparative semiconductor device preferably includes a step of removing the semiconductor particle SP. A method of removing the semiconductor particle SP is, for example, an etching method or CMP method. On the other hand, as a means for suppressing the formation of semiconductor particle SP, it is conceivable to reduce the epitaxial growth rate. However, in this means, the productivity may be lowered.

On the other hand, in present embodiment, as shown in FIG. 6A and FIG. 6B, the plurality of dummy semiconductor films Ds f are formed in the epitaxial growth step. By forming the dummy semiconductor film Dsf, the material gas that may be consumed in the formation of the semiconductor particle SP is consumed in the formation of the dummy semiconductor film Dsf. In this manner, the formation of the semiconductor particle SP can be suppressed by forming the plurality of dummy semiconductor films Dsf. Therefore, in present embodiment, the light-scattering caused by the semiconductor particle SP is suppressed. Further, since the formation of the semiconductor particle SP is suppressed, it is not necessary to perform removing the semiconductor particle SP. As a result, the properties and productivity of the semiconductor device SD can be enhanced.

(Second Effect)

As shown in FIG. 8A and FIG. 8B, the semiconductor device rSD does not include the dummy semiconductor film Dsf. Therefore, an upper surface of the second insulating film IF2 is greatly raised in the vicinity of the optical receiver OR. Flatness of the second insulating film IF2 is reduced. In this condition, even if CMP is applied to the upper surface of the second insulating film IF2, it may not be sufficiently planarized the upper surface of the second insulating film IF2. Consequently, the wiring layer WL may not be properly formed.

In contrast, as shown in FIG. 2A and FIG. 2B, the semiconductor device SD includes the dummy semiconductor film Dsf. Therefore, the second insulating film IF2 becomes substantially flat when viewed as a whole. The upper surface of the second insulating film IF2 can be properly planarized when performing CMP treatment. Alternatively, CMP treatment becomes unnecessary. Thus, it is possible to reduce the processing dispersion when forming the wiring layer WL. As a consequence, the wiring layer WL can be appropriately formed to enhance the reliability of the semiconductor device SD.

[Reference Experiment]

Figure 9:
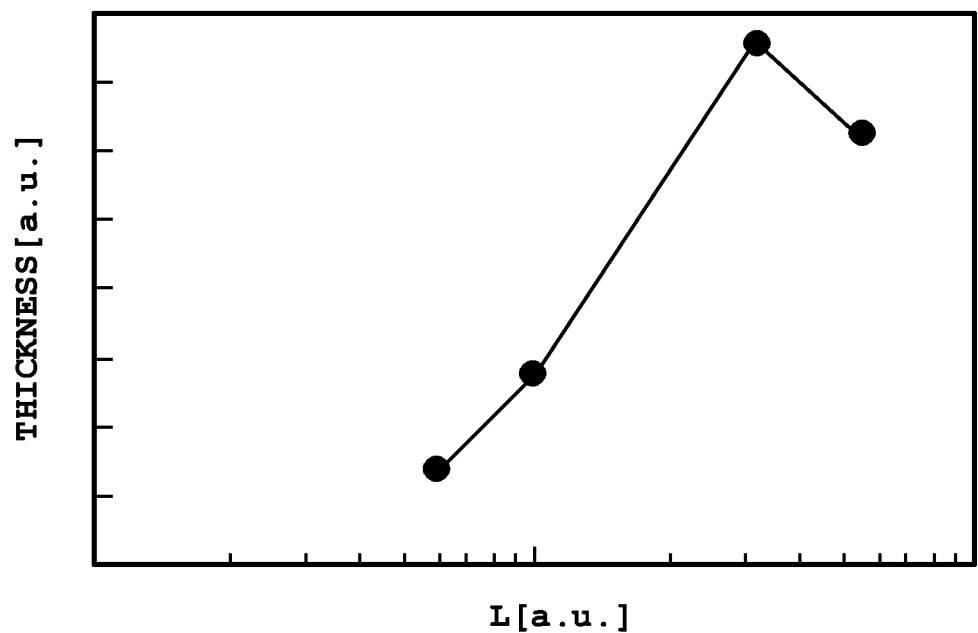
FIG. 9 is a graph showing a relationship between a length of a first side of a dummy semiconductor film and a thickness of a dummy semiconductor film.

In order to investigate the relationship between a length L of a first side of the dummy semiconductor film Dsf and the thickness of the dummy semiconductor film Dsf, experiment was carried out. FIG. 9 is a graph showing the relationship between the length L of the first side of the dummy semiconductor film Dsf and the thickness of the dummy semiconductor film Dsf.

As shown in FIG. 9, the thickness of the dummy semiconductor film Dsf increases as the length L of the dummy semiconductor film Dsf increases. The thickness of the dummy semiconductor film Dsf is saturated when the length L is equal to or greater than a predetermined size. If the length L of the dummy semiconductor film Dsf is less than the predetermined size, when the first epitaxial growth film to be the fourth semiconductor film SF4 is formed, growth of the first epitaxial growth film to be the dummy semiconductor film Dsf stops first. Then, the material gas in the epitaxial growth method begins to be supplied also on the first insulating film IF1, the semiconductor particle SP is easily formed.

In contrast, if the length L of the dummy semiconductor film Dsf is equal to or greater than the predetermined size, when forming the first epitaxial growth film to be the fourth semiconductor film SF4 constituting the optical receiver OR by the epitaxial growth method, the first epitaxial growth film to be the dummy semiconductor film Dsf continues to absorb the material gas. As a result, the formation of the semiconductor particle SP is suppressed.

[Effect]

The semiconductor device SD according to present embodiment includes the plurality of dummy semiconductor films Dsf. As a result, the formation of the semiconductor particle SP is suppressed in the epitaxial growth step. As a result, the propagation loss of light can be reduced. As a result, the characteristics of the semiconductor device SD can be enhanced. In addition, the growth rate in the epitaxial growth method can be increased. As a consequence, the productivity of the semiconductor device SD can be increased. Furthermore, it is possible to increase flatness of the second insulating film IF2. As a result, the reliability of the semiconductor device SD can be enhanced.

[Modification]

Figure 10:
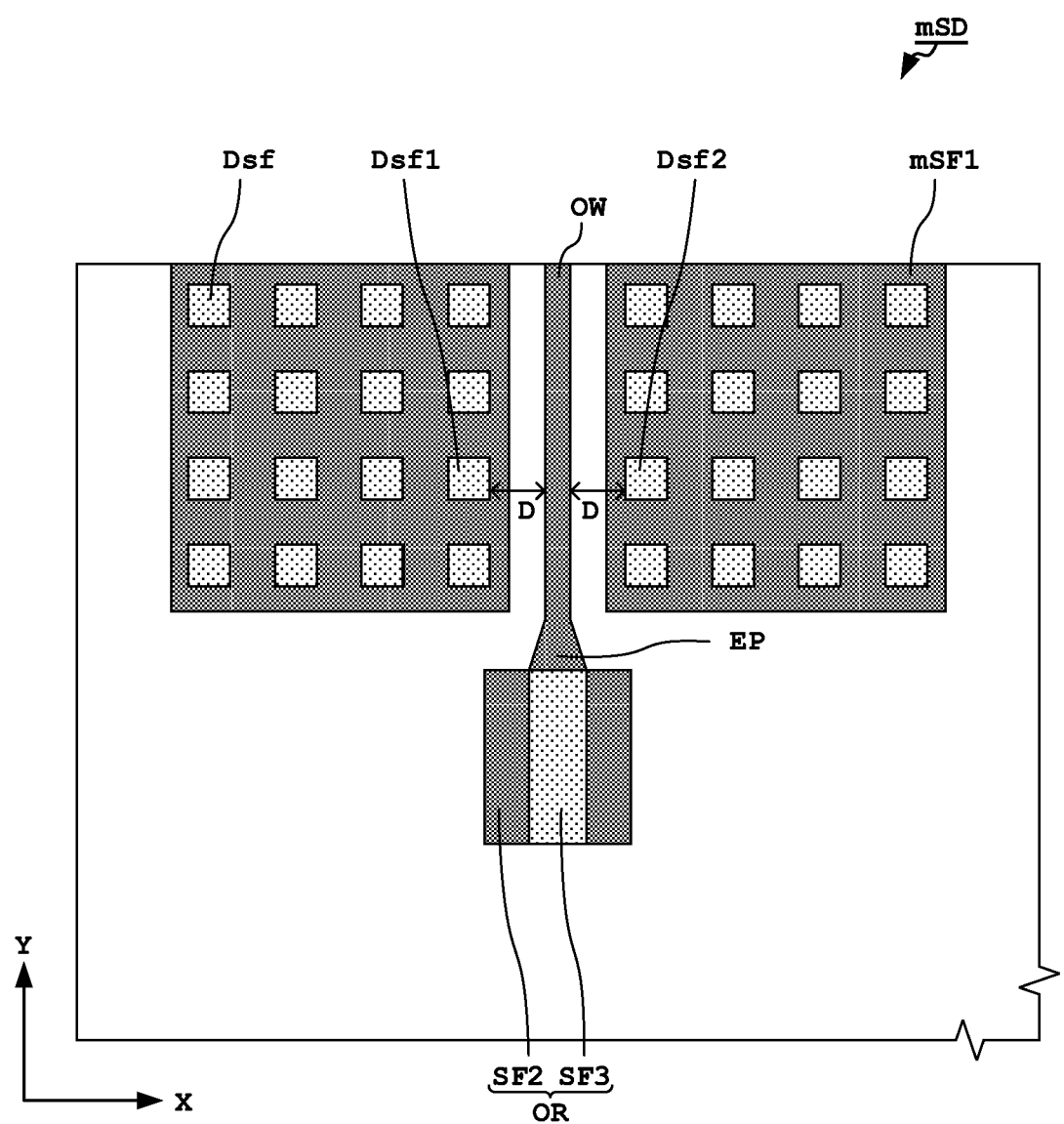
FIG. 10 is a plan view illustrating an exemplary configuration of a main portion of a semiconductor device according to modification of the embodiment.

FIG. 10 is a plan view illustrating an exemplary configuration of a main portion of a semiconductor device mSD according to a modification of the present embodiment.

As shown in FIG. 10, in the semiconductor device mSD according to the modification, the plurality of dummy semiconductor films Dsf are formed only in the vicinity of the optical waveguide OW. For example, when viewed in plan, in the X-direction, the plurality of dummy semiconductor films Dsf are not formed in the vicinity of the optical receiver OR. In the modification, the optical waveguide OW is formed between the two first semiconductor films mSF1 spaced apart from each other.

Even in the present modification, in the vicinity of the optical receiver OR and the optical waveguide OW, while increasing the flatness of the second insulating film IF2, in the vicinity of the optical waveguide OW, it is possible to suppress the formation of the semiconductor particle SP. In a region where the plurality of dummy semiconductor films Dsf are not formed, it is possible to reduce the parasitic capacitance that can be formed between the dummy semiconductor film Dsf and the wiring WR.

It should be noted that the present invention is not limited to the above embodiment, and the above modification can be made without departing from the gist thereof. For example, the dummy semiconductor film Dsf may not be formed on the semiconductor film. In this case, the dummy semiconductor film Dsf is formed on the insulating layer IL. Further, in the above embodiment, the thickness of the dummy semiconductor film Dsf in the high-density region HR, the thickness of the dummy semiconductor film Dsf in the low-density region LR has been described the same case. However, the thickness of the dummy semiconductor film Dsf in the high-density region HR may be greater than the thickness of the dummy semiconductor film Dsf in the low-density region LR. The density of the dummy semiconductor film Dsf in the two regions may be the same with each other. In this case, the thickness of the dummy semiconductor film Dsf in a region close to the optical waveguide OW is preferably greater than the thickness of the dummy semiconductor film Dsf in a region far from the optical waveguide OW.

In addition, even when a specific numerical value example is described, it may be a numerical value exceeding the specific numerical value, or may be a numerical value less than the specific numerical value, except when it is theoretically obviously limited to the numerical value. In addition, the component means "B including A as a main component" or the like, and the embodiment including other components is not excluded.

What is claimed is:

1. A semiconductor device comprising:
   an insulating layer;
   an optical waveguide formed on the insulating layer;
   a first semiconductor film formed on the insulating layer, the first semiconductor film spaced apart from the optical waveguide;
   a first dummy semiconductor film formed on the first semiconductor film;
   a second semiconductor film formed on the insulating layer, the second semiconductor film integrally formed with the optical waveguide as a single member; and
   a third semiconductor film formed on the second semiconductor film,
   wherein a material of the first dummy semiconductor film is different from a material of the optical waveguide, and
   wherein, in a plan view, a distance between the optical waveguide and the first dummy semiconductor film in a first direction perpendicular to an extending direction of the optical waveguide is greater than a thickness of the insulating layer.

2. The semiconductor device according to claim 1,
   wherein the material of the first dummy semiconductor film is a same as a material of the third semiconductor film, and
   wherein the second semiconductor film and the third semiconductor film constitute an optical receiver having a photoelectric conversion property.

3. The semiconductor device according to claim 2, comprising
   a second dummy semiconductor film formed on the first semiconductor film,
   wherein a material of the second dummy semiconductor film is a same as the material of the third semiconductor film.

4. The semiconductor device according to claim 3,
   wherein, in the first direction, the optical waveguide is formed between the first dummy semiconductor film and the second dummy semiconductor film.

5. The semiconductor device according to claim 4, comprising:
   a third dummy semiconductor film formed on the insulating layer; and
   a fourth dummy semiconductor film formed on the insulating layer,
   wherein, in the first direction, the optical receiver is formed between the third dummy semiconductor film and the fourth dummy semiconductor film.

6. The semiconductor device according to claim 5, comprising an insulating film formed on the insulating layer such that the insulating film covers the optical waveguide, the insulating film having a plurality of openings,
   wherein the first dummy semiconductor film, the second dummy semiconductor film, the third dummy semiconductor film and the fourth dummy semiconductor film are respectively formed in each of the plurality of openings.

7. The semiconductor device according to claim 5,
   wherein the material of the optical waveguide is silicon, and
   wherein the material of the first dummy semiconductor film is germanium.

8. The semiconductor device according to claim 5,
   wherein, in the plan view, a shape of the first dummy semiconductor film is substantially rectangular.

9. A method of manufacturing a semiconductor device, comprising:
   (a) providing a semiconductor wafer comprising:
   an insulating layer; and
   a semiconductor layer formed on the insulating layer;

(b) patterning the semiconductor layer to form:
an optical waveguide;
a first semiconductor film spaced apart from the optical waveguide;
a second semiconductor film integrally formed with the optical waveguide as a single member;
(c) by an epitaxial growth method, forming a first dummy semiconductor film on the first semiconductor film while forming a third semiconductor film on the second semiconductor film,
wherein a material of the first dummy semiconductor film is different from a material of the optical waveguide,
wherein, in a plan view, a distance between the optical waveguide and the first dummy semiconductor film in a first direction perpendicular to an extending direction of the optical waveguide is greater than a thickness of the insulating layer.

10. The method of manufacturing a semiconductor device according to claim 9,
wherein, in forming the first dummy semiconductor film, a second dummy semiconductor film is formed on the first semiconductor film, and
wherein a material of the second dummy semiconductor film is a same as a material of the third semiconductor film.

11. The method of manufacturing a semiconductor device according to claim 10,
wherein, in the first direction, the optical waveguide is formed between the first dummy semiconductor film and the second dummy semiconductor film.

12. The method of manufacturing a semiconductor device according to claim 11,
wherein, in forming the first and second dummy semiconductor films, a third dummy semiconductor film and a fourth dummy semiconductor film are formed on the insulating layer, and
wherein, in the first direction, an optical receiver is formed between the third dummy semiconductor film and the fourth dummy semiconductor film.

13. The method of manufacturing a semiconductor device according to claim 12,
wherein the material of the optical waveguide is silicon, and
wherein the material of the first dummy semiconductor film is germanium.

14. The method of manufacturing a semiconductor device according to claim 12,
wherein, in the plan view, a shape of the first dummy semiconductor film is substantially rectangular.

* * * * *